(12) United States Patent
Seller et al.

(10) Patent No.: US 9,252,834 B2
(45) Date of Patent: Feb. 2, 2016

(54) LOW POWER LONG RANGE TRANSMITTER

(71) Applicants: Olivier B. A. Seller, Saint Soulle (FR); Nicolas Sornin, La Tronche (FR)

(72) Inventors: Olivier B. A. Seller, Saint Soulle (FR); Nicolas Sornin, La Tronche (FR)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 14/170,170

(22) Filed: Jan. 31, 2014

(65) Prior Publication Data

US 2014/0219329 A1  Aug. 7, 2014

(30) Foreign Application Priority Data

Feb. 5, 2013  (EP) .................................. 20130154071

(51) Int. Cl.
*H04B 1/66* (2006.01)
*H03M 13/27* (2006.01)
*H04B 1/69* (2011.01)
*H03M 5/14* (2006.01)

(52) U.S. Cl.
CPC . *H04B 1/66* (2013.01); *H03M 5/14* (2013.01); *H03M 13/276* (2013.01); *H03M 13/2721* (2013.01); *H04B 1/69* (2013.01); *H04B 2001/6912* (2013.01)

(58) Field of Classification Search
CPC .... H04B 1/66; H04B 1/69; H04B 2001/6912; H03M 13/2721; H03M 13/276; H03M 5/14
See application file for complete search history.

(56) References Cited

U.S. PATENT DOCUMENTS

| 5,852,418 | A | * | 12/1998 | Ferrell et al. | 342/202 |
|---|---|---|---|---|---|
| 6,549,562 | B1 | * | 4/2003 | Olaker et al. | 375/139 |
| 6,614,853 | B1 | * | 9/2003 | Koslar et al. | 375/271 |
| 6,940,893 | B1 | | 9/2005 | Pinkney et al. | |
| 8,718,117 | B2 | * | 5/2014 | Hiscock | 375/139 |
| 2002/0003846 | A1 | * | 1/2002 | Khayrallah et al. | 375/341 |
| 2007/0002969 | A1 | * | 1/2007 | Jeong et al. | 375/298 |
| 2007/0274338 | A1 | * | 11/2007 | Sebire et al. | 370/466 |
| 2009/0180518 | A1 | * | 7/2009 | Ishii et al. | 375/130 |
| 2011/0064119 | A1 | * | 3/2011 | Sforza | 375/139 |

FOREIGN PATENT DOCUMENTS

| EP | 0952713 | A2 | 10/1999 |
|---|---|---|---|
| EP | 2278724 | A1 | 1/2011 |
| EP | 2449690 | A1 | 5/2012 |
| WO | WO-0158024 | A1 | 8/2001 |
| WO | WO-2011000936 | A1 | 1/2011 |

\* cited by examiner

*Primary Examiner* — Kenneth Lam
(74) *Attorney, Agent, or Firm* — Blank Rome LLP

(57) ABSTRACT

A transmitter device arranged to encode a set of digital input data into a succession of modulated chirps, whereby said digital input data are encoded according to a Gray code into codewords (320, 321, 322) having a plurality of bits, and having an interleaver that distributes the bits ($C_{00}, \ldots C_{nn}$) of each codeword into a series of digital modulation values ($S_0, \ldots S_7$), at different bit positions, and to synthesize a series of modulated chirps whose cyclical shifts are determined by the modulation values. A special frame structure is defined in order to ensure high robustness, and variable bit-rate flexibility.

15 Claims, 3 Drawing Sheets

|     | $S_0$ | $S_1$ | $S_2$ | $S_3$ | $S_4$ | $S_5$ | $S_6$ |
| --- | --- | --- | --- | --- | --- | --- | --- |
| $m=0$ | $C_{00}$ | $C_{61}$ | $C_{52}$ | $C_{43}$ | $C_{34}$ | $C_{25}$ | $C_{16}$ |
| $m=1$ | $C_{10}$ | $C_{01}$ | $C_{62}$ | $C_{53}$ | $C_{44}$ | $C_{35}$ | $C_{26}$ |
| $m=2$ | $C_{20}$ | $C_{11}$ | $C_{02}$ | $C_{63}$ | $C_{54}$ | $C_{45}$ | $C_{36}$ |
| $m=3$ | $C_{30}$ | $C_{21}$ | $C_{12}$ | $C_{03}$ | $C_{64}$ | $C_{55}$ | $C_{46}$ |
| $m=4$ | $C_{40}$ | $C_{31}$ | $C_{22}$ | $C_{13}$ | $C_{04}$ | $C_{65}$ | $C_{56}$ |
| $m=5$ | $C_{50}$ | $C_{41}$ | $C_{32}$ | $C_{23}$ | $C_{14}$ | $C_{05}$ | $C_{66}$ |
| $m=6$ | $C_{60}$ | $C_{51}$ | $C_{42}$ | $C_{33}$ | $C_{24}$ | $C_{15}$ | $C_{06}$ |

Fig. 3a

|     | $S_0$ | $S_1$ | $S_2$ | $S_3$ | $S_4$ | $S_5$ |
| --- | --- | --- | --- | --- | --- | --- |
| $m=0$ | $C_{00}$ | $C_{61}$ | $C_{52}$ | $C_{43}$ | $C_{34}$ | $C_{25}$ |
| $m=1$ | $C_{10}$ | $C_{01}$ | $C_{62}$ | $C_{53}$ | $C_{44}$ | $C_{35}$ |
| $m=2$ | $C_{20}$ | $C_{11}$ | $C_{02}$ | $C_{63}$ | $C_{54}$ | $C_{45}$ |
| $m=3$ | $C_{30}$ | $C_{21}$ | $C_{12}$ | $C_{03}$ | $C_{64}$ | $C_{55}$ |
| $m=4$ | $C_{40}$ | $C_{31}$ | $C_{22}$ | $C_{13}$ | $C_{04}$ | $C_{65}$ |
| $m=5$ | $C_{50}$ | $C_{41}$ | $C_{32}$ | $C_{23}$ | $C_{14}$ | $C_{05}$ |
| $m=6$ | $C_{60}$ | $C_{51}$ | $C_{42}$ | $C_{33}$ | $C_{24}$ | $C_{15}$ |
| $m=7$ | $C_{70}$ | $C_{61}$ | $C_{52}$ | $C_{43}$ | $C_{34}$ | $C_{25}$ |
| $m=8$ | $C_{80}$ | $C_{71}$ | $C_{62}$ | $C_{53}$ | $C_{44}$ | $C_{35}$ |
| $m=9$ | $C_{90}$ | $C_{81}$ | $C_{42}$ | $C_{63}$ | $C_{54}$ | $C_{45}$ |

Fig. 3b

|     | $S_0$ | $S_1$ | $S_2$ | $S_3$ | $S_4$ | $S_5$ | $S_6$ | $S_7$ |
| --- | --- | --- | --- | --- | --- | --- | --- | --- |
| $m=0$ | $C_{00}$ | $C_{61}$ | $C_{52}$ | $C_{43}$ | $C_{34}$ | $C_{25}$ | $C_{16}$ | $C_{17}$ |
| $m=1$ | $C_{10}$ | $C_{01}$ | $C_{62}$ | $C_{53}$ | $C_{44}$ | $C_{35}$ | $C_{26}$ | $C_{27}$ |
| $m=2$ | $C_{20}$ | $C_{11}$ | $C_{02}$ | $C_{63}$ | $C_{54}$ | $C_{45}$ | $C_{36}$ | $C_{37}$ |
| $m=3$ | $C_{30}$ | $C_{21}$ | $C_{12}$ | $C_{03}$ | $C_{64}$ | $C_{55}$ | $C_{46}$ | $C_{47}$ |
| $m=4$ | $C_{40}$ | $C_{31}$ | $C_{22}$ | $C_{13}$ | $C_{04}$ | $C_{65}$ | $C_{56}$ | $C_{57}$ |

Fig. 3c

LOW POWER LONG RANGE TRANSMITTER

REFERENCE APPLICATION

This application claims priority from European Patent application EP13154071.8 of Feb. 5, 2013, the contents whereof are hereby included by reference.

FIELD OF THE INVENTION

The present invention concerns, in embodiments, a method of transmitting information on a radio channel and, in particular, a wireless transmission scheme that can span long distances with a low power consumption, based on chirp spread spectrum. Embodiments of the inventions relate likewise to low-complexity transmitting and receiving devices suitable for wireless transmission according the inventive transmission scheme.

DESCRIPTION OF RELATED ART

Digital wireless data transmission is used in a wide variety of systems that present a great variability in both in data rate, transmission range, and power consumption. There is however a need of a digital transmission scheme that allies a long transmission range with low power consumption, and can be realized with simple receivers and transmitters.

Spread-spectrum modulation techniques are used to improve the immunity to noise and interferences in radio communication, the various Bluetooth® protocols are examples of such techniques. These modulation schemes use frequency-hopping spread-spectrum and achieve low consumption and good bandwidth, but their range is limited to a few meters.

Direct-sequence spread-spectrum techniques are also known and can reach very high levels of coding gain. in some cases, like in GPS system, have shown excellent noise immunity over long ranges. Limitations of these techniques are however the comparatively high complexity of the receivers, the acquisition times that can be very long for weak signals, and their power consumption.

European patent application EP2449690 describes a communication system using digitally-synthesized chirp symbols as modulation, and a suitable FFT based receiver.

Chirp generation in various kind of radiofrequency circuits is known, for example U.S. Pat. No. 6,549,562 describes a method for generating modulated chirp signal, while EP0952713 shows a synchronisation process based on chirp signals.

U.S. Pat. No. 6,940,893 and U.S. Pat. No. 6,614,853, among others, describe generation and use of chirp signal by passing an impulsive signal through a dispersive filter, and communication schemes based thereupon.

EP2278724 describes a transmitter that generates and uses modulated chirps, whose instantaneous frequencies vary according to one of a plurality of functions that are cyclical shifts of a base chirp function; WO0158024 relates to a transmitter system having an interleaver and employing Gray codes.

BRIEF SUMMARY OF THE INVENTION

The present invention relates various aspects of a transmission system that uses chirp modulation and a specific data format in such a manner as to achieve the above goal.

In particular, the object of the invention can be achieved by the transmitter and the receiver having the features of the appended claims.

BRIEF DESCRIPTION OF THE DRAWINGS

The invention will be better understood with the aid of the description of an embodiment given by way of example and illustrated by the figures, in which:

FIGS. 3a, 3b, 3c illustrate three interleaving schemes according to one aspect of the invention.

DETAILED DESCRIPTION OF POSSIBLE EMBODIMENTS OF THE INVENTION

Figure 1:
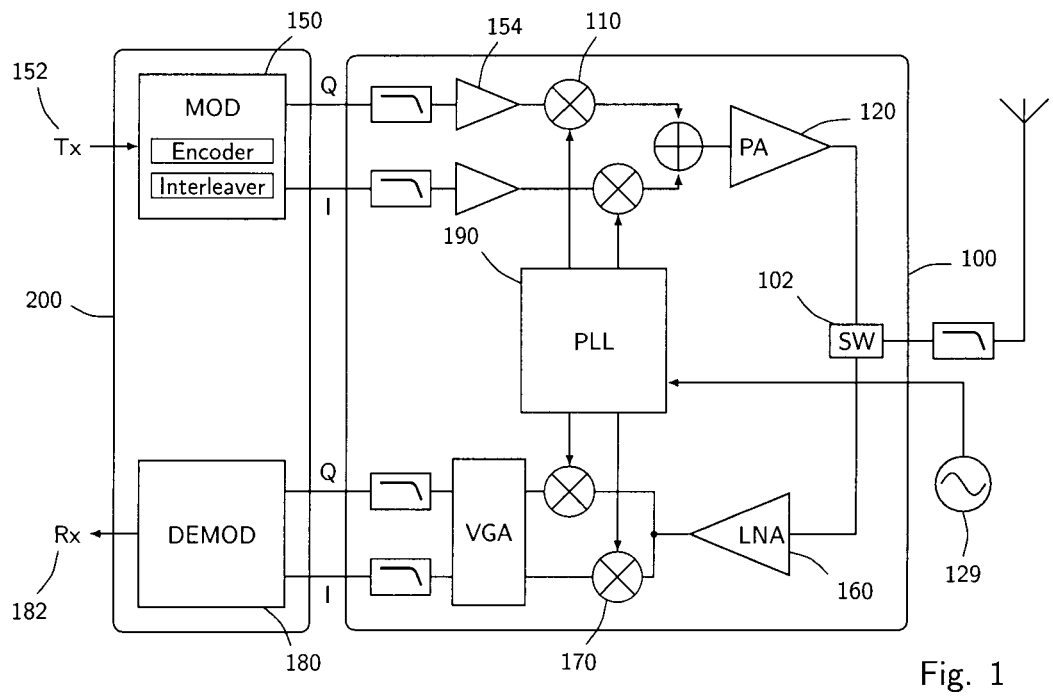
FIG. 1 shows, in schematic simplified fashion, the structure of a radio modem according to one aspect of the present invention.

Several aspects of the chirp modulation technique employed in the present invention are described in European Patent Application EP2449690, that is hereby incorporated by reference, and will be reminded here summarily. The radio transceiver that is schematically represented in FIG. 1 is a possible embodiment of the invention. The transceiver includes a baseband section 200 and a radiofrequency section 100. Concentrating on the transmitter part, the baseband modulator 150 generates, based on the digital data 152 that are present at its input, a baseband signal whose I and Q component are converted to the desired transmission frequency by the RF section 100 amplified by the power amplifier 120, and transmitted by the antenna.

The architecture presented allows several variants and modifications, without departing from the frame of the invention, and is provided as non-limiting example. In a possible embodiment, polar components, amplitude A, and phase ϕ, rather than the Cartesian component I and Q could be synthesized.

The conversion of the signal from the baseband to the intended frequency is done, in this example, by mixing in mixer 110 the signal provided by amplifiers 154 with the in-phase and quadrature components of a local carrier generated by circuit 190, and linked to a reference clock 129.

Once the signal is received on the other end of the radio link, it is processed by the receiving part of the transceiver of FIG. 1 comprises a low noise amplifier 160 followed to a down-conversion stage 170 that generates a baseband signal comprising a series of chirps, that is then processed by the baseband demodulator 180, whose function is the reverse of that of the modulator 150, and provides a reconstructed digital signal 182.

As discussed in EP2449690, the modulator 150 synthesizes a baseband signal that comprises a series of chirps whose frequency changes, along a predetermined time interval, from an initial instantaneous value $f_0$ to a final instantaneous frequency $f_1$. It will be assumed, to simplify the description, that all the chirps have the same duration T, although this is not an absolute requirement for the invention.

The chirps in the baseband signal can be described by the time profile f(t) of their instantaneous frequency or also by the function φ(t) defining the phase of the signal as a function of the time. Importantly, the modulator 150 can generate chirps having a plurality of different profiles, each corresponding to a symbol in a predetermined modulation alphabet.

Figure 2A:
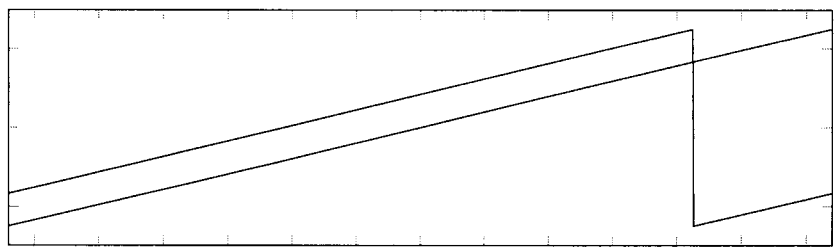
FIG. 2a plots the instantaneous frequency of a base chirp and of a modulated chirp according to one aspect of the invention. The phase of the same signals is represented in FIG. 2b, and FIG. 2c plots the real and of the complex component of the base chirp, in the time domain.
Figure 2B:
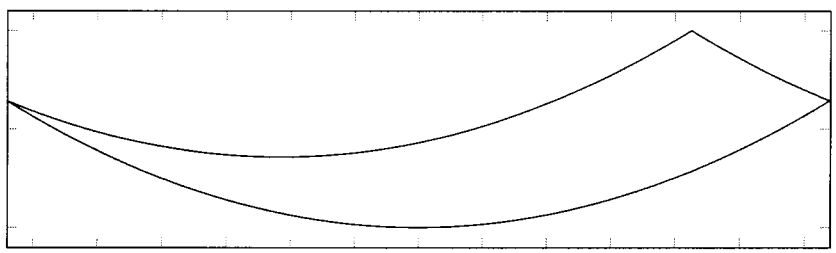
Figure 2C:
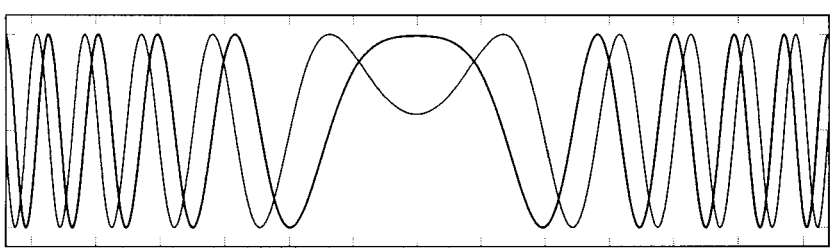

According to an important feature of the invention, the modulator 150 can generate either base chirp (also called unmodulated chirps in the following) that have specific and predefined frequency profile, or one out of a set of possible modulated chirps, obtained from base chirps by time-shifting cyclically the base frequency profile. FIG. 2a illustrates, by way of example, possible frequency and phase profiles of a base chirp and of one modulated chirps between the time instant $t=t_0$ at the beginning of a chirp and the instant $t=t_1$ at the end of the chirp, while FIG. 2b shows the corresponding baseband signals in the domain of time. The horizontal scale corresponds for example to a symbol and while the plots are represented as continuous, they will be represented by a finite number of discrete samples, in a concrete implementation. As to the vertical scales, they are normalized to the intended bandwidth and to the corresponding phase span. The phase, in particular, is represented in FIG. 2b as if it were an unbounded variable, in order to show better its continuity, but it may in fact span across several revolutions in a concrete implementation.

In the example depicted, the frequency of a base chirps increases linearly from an initial value $f_0=-BW/2$ at, to a final value $f_1=BW/2$, where BW stands for the amount of bandwidth spreading, but descending chirps or other chip profiles are also possible. Thus, the information is encoded in the form of chirps that have one out of a plurality of possible cyclic shifts with respect to a predetermined base chirp, each cyclic shift corresponding to a possible modulation symbol.

Preferably, the modulator is also arranged to synthesize and insert in the signal conjugate chirps, that is chirps that are complex-conjugate of the base unmodulated chirp. One can regard these as down-chirps, in which the frequency falls from a value of $f_0=+BW/2$ to $f_1=-BW/2$.

Preferably, the phase of the chirps is described by a continuous function φ(t), that has the same value at the beginning and at the end of a chirp: $φ(t_0)=φ(t_1)$. Thanks to this, the phase of the signal is continuous across symbol boundaries, a feature that will be referred to in the following as inter-symbol phase continuity. In the example shown in FIG. 2a, the function f(t) is symmetrical, and the signal has inter-symbol phase continuity. As is explained in more detail by EP2449690, the structure of the signal described above allows the demodulator unit 180 in the receiver to align its time references with that of the transmitter, and the determination of the amount of cyclical shift imparted to each chirp by multiplying for a complex conjugate of the base chirp, and performing a FFT. The position of the maximum of the FFT is indicative of the shift, and of the modulation value. Thus, "cyclic shift value" may be used in the following to indicate the modulation in the time domain, and "modulation position", or "peak position" represents it in the frequency domain.

We note N the length of the symbol, or equivalently the spreading factor. To allow easy reception using FFT, N is preferably chosen to be a power of two. The Nyquist sampling frequency if 1/BW, and the length of a symbol is N/BW. To fix the ideas, but without limiting the invention to these specific numeric values, we can imagine that, in a possible application, BW be 1 MHz, and N equal 1024, 512, or 256. The carrier frequency may be in the 2.45 GHz ISM band. In this particular embodiment, the modulation schema of the invention could occupy the same RF band as a Bluetooth® transceiver and, possibly, reuse or share the RF parts of a Bluetooth® transceiver.

Hence, a modulated symbol is a cyclic shift of the base symbol, of any number between 0 and N−1. A modulation value of 0 is equivalent to the absence of modulation. Since N is a power of two, the value of the cyclic shift can be coded over $log_2 N$ bits.

Preferably, the transmitting system offers variable bit rate using two mechanisms: a variable spreading factor, and a variable error correction coding rate. The spreading factor is implicit, such that the receiver needs to know in advance which spreading factor it will try to detect, synch and demodulate. The coding rate is explicit and preferably embedded in the header.

Having a common preamble to all spreading factor would ease link rate adaptation, but this is way too high a cost for high data rates. Therefore the preamble size preferably scales exactly with spreading factor. Varying the spreading factor allows to change the processing gain, and the range. Varying the coding rate is the way to get robustness against interferers and clock errors.

Preferably, information bits presented 152 to the input of the modulator 150 are grouped by sets of ND bits, To simplify the description, the following will often refer to the ND=4 case, which correspond to a typical embodiment but is not by itself a limiting feature of the invention.

Taking then ND=4, each set of 4 information bits gives a codeword, formed by the 4 information bits, if the chosen code is systematic, and a predetermined number RDD of redundancy bit that can ne 0, 1, 2, 3, or 4 for example. We thus have coding rate 4/(4+RDD). The codewords are kept in the natural order before interleaving.

Several error correction codes could be used in the scope of the invention including, but not limited to, Hamming codes. Embodiments of the invention relate to transmission of short messages over long range links and, in this case, short codes are preferable.

In a possible implementation having 4/7 data rate, the (7,4,dmin=3) Hamming code can be used. Parity extended Hamming codes can be used when a higher error correction capability is desired, for example parity extended Hamming code (8,4,4) with rate 4/8. On the other hand the invention could also use a systematic, shortened hamming code with rate 4/6, a plain parity codes with rate 4/5 or the identity, i.e. no coding, for rate 1. These short codes also offer the option to have iterative decoding/demodulation, to trade receiver's complexity for better performances, using a common transmitter.

The modulation is using Gray indexing, from a set of $log_2 N$ bits to the modulation position. According to an important aspect of the invention, size of the modulation set, i.e. the number of possible values that can be encoded in a given symbol, is variable. When a reduced set is used, the Gray mapper sets the least significant bits to zero. The number of input bits to the mapper, for a symbol, is noted PPM. For normal set we have $PPM=log_2 N$, for a reduced set in which two bits are set to zero, hence using only one quarter of the available symbols, we have $PPM=log_2 N-2$, for example.

Gray indexing is advantageous since most demodulation errors will exhibit an error are of ±1 modulation position. Using Gray mapping limits the number of bits in error to one in this case. When a reduced set is used, +1 or −1 modulation position errors simply don't occur, because the receiver can restore without ambiguity at demodulation the symbol that was transmitted, as long as the possible modulation values are all separated by at least 3 (so 4 to have an integer number of bits) units of shift, as it will be explained in the following.

Preferably, the modulation comprises a step of interleaving the codewords before the symbol generation, and, correspondingly, the demodulation process a step of de-interleaving. As mentioned above, the errors of ±1 in the demodulated position have a much higher probability of occurring. Hence, there is a higher error probability for least significant bits: bit0 sees twice as much errors as bit1, which sees twice as much as bit2, and so on.

The interleaver is preferably diagonal, not row-line, such that each codeword experiences different bit reliabilities. In fact, with Gray signalling and errors of one position, the least significant bit of modulation, i.e. the last redundancy bit, is always weaker than the first. Mapping a codeword to only such least significant bits would make this particular codeword very weak. Thanks to diagonal interleaving, for instance, with coding rate 4/7 or 4/8, the decoder can sometimes correct a +1/−1 position error on each demodulated symbol. With row-line interleaving, it could only take a single symbol error, and Gray mapping wouldn't be used effectively.

Interleaving is not only present to help with ±1 position demodulation errors. In case of interferer, a full symbol can be in error, i.e. none of its demodulated bits are reliable. If the receiver is able to detect interference presence, these errors can be turned into erasures, and the parity Hamming code can correct up to 3 of those: 3 out of 8 symbols can be erased by interference, still allowing reception. This is practical because long range transmissions are low data rate, therefore messages are long, potentially much longer than interferences.

FIG. 3*a* represent a first example of interleaver operating on interleaving blocks having a length equal to PPM. Codewords are grouped by sets of PPM before interleaving. Since it spans PPM codewords, the number of bits in an interleaving bloc equals (4+RDD)*PPM. Thus, the interleaver also spans (4+RDD) modulation symbols.

Let $C_{i,j}$ be bit j of codeword i, and let's assume 0≤i<PPM and 0≤j<4+RDD. Let $S_{k,m}$ be bit m of modulated symbol k. this is for 0≤k<4+RDD and 0<=m<PPM. The interleaver is defined as $$S_{j,mod(i+j,PPM)} = C_{i,j}, \text{ for } 0 \le i < PPM \text{ and } 0 \le j < 4+RDD$$

or equivalently as $$S\_(k,m) = C\_(mod(m-k,PPM),k) \text{ for } 0 \le k < 4+RDD \text{ and } 0 \le m < PPM$$

In the example represented in FIG. 3*a*, we have chosen arbitrarily PPM=4+RDD=7. Each column represents a symbol. Arrows 320, 321, 322 and the cells with patterned background indicate three codewords, whose bits that are interleaved and distributed diagonally at cyclically increasing positions inside successive modulation values. Codeword 320, for example, comprises seven bits, $C_{00} \ldots C_{06}$ the first 4 bits being information bits, and the remaining ones are redundancy bits. Only three codewords are highlighted, in order to avoid cluttering the graphics.

The first line m=0 represents the LSB of all modulated symbols, this is the weakest modulated bit in case of single position error. in this case the interleaver is 7 symbols long, and each symbol needs 7 bits to code the modulated position. Symbol 4, for instance, on bit 6, takes the fourth bit of codeword 2, $C_{24}$. Importantly, each codeword is so interleaved as to have only one bit in the weakest position and, moreover, the weak bit is not always at the same position in the codeword. This improves the effectiveness of the error correction code and the robustness of the Gray signalling.

FIG. 3*b* shows another possible example of diagonal interleaver, in which the codewords are shorter than the symbol length, in that PPM=10, and the codewords have length 4+RDD=6. Also in this example, each codeword is so interleaved as to have only one bit in the weakest position of each symbol, and the weak bits do occur at variable position inside the codeword.

FIG. 3*c*, on the other hand, shows a possible interleaving scheme in which the codewords are longer than the symbol length in bits, namely, the symbols have a length of 5 bits, PPM=5 and the codewords of 8 bits, for example including 4 data bits, and 4 correction bits, such that 4+RDD=8. In this case, some codewords, for example codeword 320, get two weak bits, and other, for example codewords 321, 322 only one. Still the diagonal interleaving scheme distributes the weak bits of the m=0 row equally among the codewords, and they do not occur always at the same position.

It will be appreciated that the diagonal interleaving scheme of the invention allows an optimal use of the redundancy bits combined with the Gray signalling, thanks to the fact that the symbols are encoded as cyclical shifts, and the errors essentially errors of ±1 in the determination of the shift. Moreover, the diagonal interleaver leaves a great flexibility both in the choice of the symbol size PPM and of the codeword length, thus in the invention can offer variable bit rates, according to the needs and the state of the channel, both by changing the spreading factor, or the coding rate.

Figure 4:
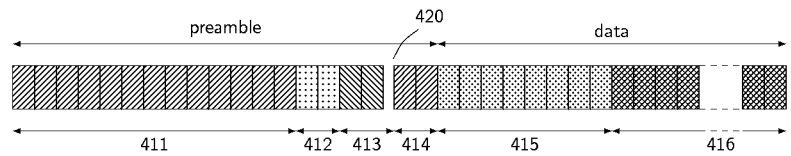
FIG. 4 illustrates schematically a possible structure of a data frame according to the invention.

According to another aspect of the invention, the transmitted signals is organised in frames that include a preamble and a data section. FIG. 4 illustrates a possible frame structure for the invention. Each rectangle represents a chirp symbol in a time series that runs, conventionally, from left to right. The preamble begins with a detect sequence 411 of base (i.e. un-modulated, or with cyclic shift equal to zero) symbols. The detect sequence 411 is used in the receiver to detect the beginning of the signal and, preferably, perform a first synchronisation of its time reference with the time reference in the transmitter. By multiplying the demodulated detect sequence by a locally-synthesized conjugate chirp, and performing a FFT operation, the receiver is able to determine a shift amount.

The length of the detect sequence can be arbitrarily long. This is used in application in which communications are sparse and separated by long intervals of inactivity during which the receivers are in low-power standby modes. The receiver exhibits in general an idle time, upon reception of a first signal, for commuting from the standby state into a fully awake state. The preamble is preferably chosen longer than the idle time of receivers, which ensures a high probability of preamble detection.

The end of the detect sequence is marked by one or more, preferably two, frame synchronisation symbols 412 that are chirps modulated with predetermined values, for example a first chirp with a modulation value of 4, and a second one with the opposite modulation N−4. These modulated symbols are used to get a frame synchronization. In the example shown, the receiver looks for the presence of 3 consecutive symbols: unmodulated, modulated with first value, modulated with second value. Since the reception errors are mostly ±1 offsets, it would not be advisable choosing these values for the frame synchronisation symbols 412. Preferably the modulation of the frame synchronisation symbols is larger, in absolute shift, than 3 units, so as to minimize the likelihood of errors.

The use of a single modulated symbol as frame synch marker is possible, but not optimal for low signal to noise ratios, where it could lead to false frame synch events, as soon as a demodulation error occurs from 0 to—say—4. The use of the same modulation value for several symbols also possible, albeit less robust, because a single demodulation error can offset the frame synch by one symbol.

The predetermined modulation values of the frame synchronisation symbols 412 can be used also as network signature, allowing the coexistence of several networks without receiving each other's packets. When the receiver tries to achieve frame synch using different pre-determined values than the frame it is receiving, frame synch will fail as the expected sequence will not occur. When used for this purpose, the frame synchronization symbols modulation values should be unique to a network. For 2 symbols the sets can be, for instance, {3, N−3} for the first network, then {6,N−6}, then {9, N−9}, etc. Again, separation of 3 values is important because the most likely demodulation errors are ±1 offsets in modulation value.

According to another aspect of the invention, the preamble includes preferably frequency synchronisation symbols 413 that consist in one or more, preferably two chirps that are complex-conjugate of the base unmodulated chirp. One can regard these in the baseband representation as down-chirps, in which the frequency falls from a value of $f_0=+BW/2$ to $f_1=-BW/2$. Once frame synch is achieved, the receiver can demodulate these, using a modified processing sequence: the baseband signal is multiplied by the complex conjugate of the sequence used to demodulate all other symbols in preamble and data, and then FFT-transformed.

While conjugate symbols for frequency synchronisation are effective, this is not the only possibility, and the invention is not necessarily so limited. The conjugate symbols may be replaced in fact by chirps that have a different bandwidth or duration than the base chirps, thus exhibiting a frequency variation that is faster, or slower than that of the base chirps. This variant would require a more complex receiver, but, on the other hand, leaves the conjugate-chirps free to use for data transmission.

The apparent value of modulation will give the frequency error, thanks to the time-frequency equivalence property of chirps. To let the receiver align in time, a silence 420 is inserted after the symbols 413.

Two symbols are better than one, because some repetition is necessary not to make a demodulation error. Also, since the two symbols are modulated with the same starting phase, a fine frequency error can be extracted.

Optionally, the header further includes fine synchronisation symbols 414 that are unmodulated base chirps, for example, and give the opportunity of a fine time and frequency synchronization and allows the implementation of fully coherent receivers simply, as well as more compact headers in the data symbols and, equivalently, higher bit rates. It is possible to process these symbols as outlined above, multiplying them by a conjugate symbol, extracting an FFT, and determining a peak position that corresponds to a fine time shift. Such fine time shift is not subject to drift, because once coarse synchronisation has been achieved, systematic sampling drifts due to offsets in crystal references are properly accounted for. The comparison of relative phases of this peak in different symbols allows to synchronise finely the frequencies between transmitter and receiver.

If the frequency synchronisation relies on the frequency synchronization symbols 413 only, some frequency offsets can result in an error of one modulation position: these are frequency offsets such that the demodulations of down-chirps give two identically likely values (these are adjacent values). A simple receiver is not able to discriminate the two values, and can take the wrong decision, yielding a small residual frequency offset, and half of a modulation position timing error. Such an error can give a full position modulation error, depending on noise. An alternative way to give better robustness to the receiver right after frequency synchronization is the reduced set of modulation values, at the expense of lower data rate.

In addition to performing fine time alignment, these symbols can give another fine frequency error estimate. This allows the implementation of simple coherent receivers, which in turn makes possible the modulation of the phase of symbols, in addition to cyclic shifts as modulation method.

The header part of the frame is a data field 415 that describes how to decode the information bits. The header content determines the decoding of large sections of the message and, therefore, it is preferably modulated with a reduced set of cyclic shifts, for example one possible position every four positions, i.e. PPM=log(N)−2. Since the most likely demodulation errors are ±1 modulation position offset, this reduces significantly the probability that the header is not correctly decoded. Different reduction factors are also possible and included in the scope of the invention. A reduced set which is one third of the total set is also feasible, but this would not give an integer number of bits per symbol when the symbol size is, as it is usually a power of two. This technique of encoding part of the chirps with a reduced set of cyclic shifts can be used in other sensitive part of the transmitted data, whenever the likelihood of decoding errors is needed to be reduced.

Preferably, the header 415 is encoded using the lowest coding rate, RDD=4, so as to give best protection, and comprises a header CRC to check header data integrity.

The header 415 can include all sort of data useful to decode the payload. According to a possible implementation of the invention, the header fields are coding rate, enable of payload CRC, payload length, CRC, a burst mode indication, a compressed mode indication, some reserved bits, and a ranging bit. When the ranging bit is set, the header data has different meaning except header CRC.

The payload 416 contains the digital data that whose transmission was intended, preferably encoded and interleaved as explained above.

Figure 5:
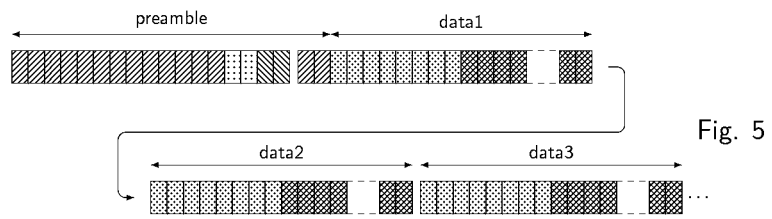
FIGS. 5 and 6 show the structures of data frames in a compressed mode, respectively in a burst mode.

The compressed mode indication bit indicates that after current payload, will follow another frame comprising a header and payload without preamble as illustrated FIG. 5. This is to transmit long sequences of data without having the full penalty of inserting a preamble before each payload, or to reduce the payload size when for instance there is strong interference. Indeed it can be interesting to send short packets, to maximize individual probability of success, but then preamble limits data rate.

Figure 6:
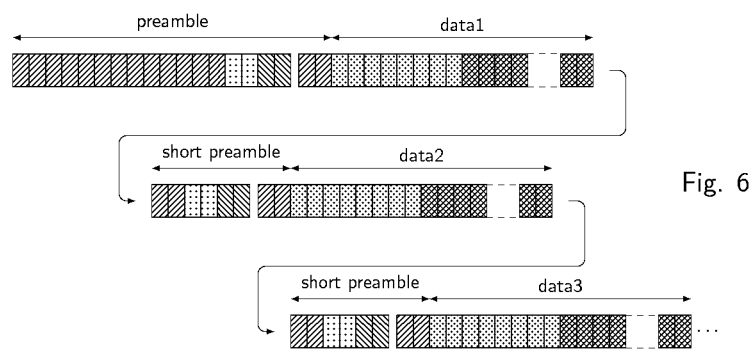

The burst mode indication bit indicates that after current payload, will follow another frame comprising a reduced length preamble, a header and a payload. This serves the same goal as previous mode, with more robustness thanks to the ability to resynchronize the receiver from the preamble. Shorter preamble means much less detection symbols, but this is not inconvenient since the presence of the frame is certain in this situation. Burst mode is illustrated in FIG. 6.

The payload (416 on FIG. 4) is preferably modulated using the full set of potential modulation values, but It is possible also, under given circumstances, to fallback to a reduced set in order to enhance robustness. This is in particular useful for high spreading factors, when the reference clock shows significant jitter between symbols.

Figure 7:
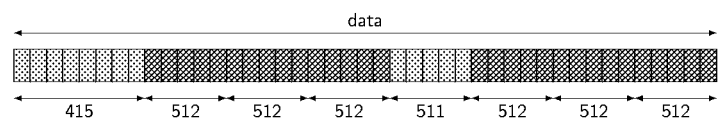
FIG. 7 illustrates a data field including pilot symbols.

According to an aspect of the invention, with an aim of improving the robustness without sacrificing the data rate, the payload includes "pilot symbols" as illustrated in FIG. 7. These are symbols which use reduced modulation set, within the payload. In the represented example, in which the coding rate is 4/5, symbols form coding groups 512 containing 5 adjacent symbols (see next). One every four of such groups can be encoded with a reduced modulation set 511, i.e. five symbols every twenty symbols. This is enough for a simple receiver to track timing, without compromising data rate. The repetition rate of such pilot symbols is a configuration known by both receiver and transmitter and is, for example, made known to the receiver by an appropriate field in the header.

The invention claimed is:

1. A transmitter device comprising:
   an encoder operatively arranged for encoding digital message according to a Gray code into codewords having a plurality of bits;
   an interleaver arranged for interleaving the bits of each of said codewords into a series of digital modulation values, at different bit positions; and
   a modulator arranged for synthesizing a series of modulated chirps whose instantaneous frequencies vary according to one of a plurality of a functions that are cyclical shifts of one base chirp function, wherein said modulator embeds the series of modulated chirps in data frames, said data frames having a preamble with unmodulated chirps, and frame synchronization symbols having a predetermined modulation value.

2. The transmitter of claim 1, wherein the interleaver is diagonal and distributes the bits of each codeword at cyclically increasing positions inside successive modulation values.

3. The transmitter of claim 1, comprising a generator of correction codes, whereby each codeword includes data bits and error correction bits.

4. The transmitter of claim 1, wherein the preamble further includes frequency synchronization symbols that are complex conjugate of the base chirp function.

5. The transmitter of claim 1, wherein the preamble further includes a silence.

6. The transmitter of claim 5, wherein the silence is followed by base unmodulated symbols for fine frequency and/or time synchronization.

7. The transmitter of claim 1, wherein part of the chirps are modulated with a reduced set of cyclic shifts.

8. A method of transmitting a digital message, the method comprising: encoding the digital message according to a Gray code into codewords having a plurality of bits, interleaving the bits of each of said codewords into a series of digital modulation values, at different bit positions, synthesizing a series of modulated chirps whose instantaneous frequencies vary according to one of a plurality of a functions that are cyclical shifts of one base chirp function, and embedding said modulated chirps in data frames having a preamble with unmodulated chirps, whose instantaneous frequency vary according to the base chirp function, and frame synchronization symbols having a predetermined modulation value.

9. The method of claim 8 wherein a phase of said series of modulated chirps is essentially continuous.

10. The method of claim 8, wherein said interleaving distributes the bits of each of said codewords at cyclically increasing positions inside successive modulation values.

11. The method of claim 8, comprising inserting in the message correction codes, whereby each codeword includes data bits and error correction bits.

12. The method of claim 8, comprising inserting in said preamble frequency synchronisation symbols that are complex conjugate of the unmodulated symbols.

13. The method of claim 8, comprising inserting in said preamble a silence.

14. The method of claim 13, comprising following said silence is followed with unmodulated symbols.

15. The method of claim 8, comprising modulating part of the chirps with a reduced set of cyclic shifts.

* * * * *